United States Patent
Kim et al.

(10) Patent No.: US 7,342,792 B2
(45) Date of Patent: Mar. 11, 2008

(54) CHASSIS STRUCTURE FOR PLASMA DISPLAY MODULE AND PLASMA DISPLAY MODULE INCLUDING THE CHASSIS STRUCTURE

(75) Inventors: Guy-Seong Kim, Suwon-si (KR); Won-Kyu Bang, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 186 days.

(21) Appl. No.: 11/254,867

(22) Filed: Oct. 21, 2005

(65) Prior Publication Data
US 2006/0125365 A1   Jun. 15, 2006

(30) Foreign Application Priority Data
Dec. 10, 2004   (KR) .................... 10-2004-0104035

(51) Int. Cl.
*H05K 7/20* (2006.01)
(52) U.S. Cl. .................. 361/704; 361/681; 361/688; 313/46; 313/493; 313/582; 313/584; 313/587; 165/104.33; 165/185
(58) Field of Classification Search ................ 361/681, 361/700–704, 709, 719, 698, 699, 687; 174/15.1, 174/16.1, 16.3; 165/80.2, 80.3, 185; 313/46, 313/493, 573, 582, 634, 40, 48, 581, 45, 313/44; 362/294; 345/60, 68, 76–77, 94, 345/204–206; 349/20, 32, 73, 121, 161, 349/56, 58, 59
See application file for complete search history.

(56) References Cited
U.S. PATENT DOCUMENTS 6,288,489 B1 * 9/2001 Isohata et al. .............. 313/582
6,373,702 B2 * 4/2002 Oishi et al. ................. 361/704
6,744,186 B2 * 6/2004 Oishi et al. ................. 313/46
6,833,674 B2 * 12/2004 Kaneko et al. ............. 313/587
7,133,281 B2 * 11/2006 Bae ............................ 361/681
7,167,365 B2 * 1/2007 Fu et al. ..................... 361/697
7,215,549 B2 * 5/2007 Kim .......................... 361/704

FOREIGN PATENT DOCUMENTS

| JP | 7-212689 | | 8/1995 |
| JP | 9-199040 | | 7/1997 |
| JP | 11-233968 | * | 8/1999 |
| JP | 2001-345586 | | 12/2001 |

OTHER PUBLICATIONS

Korean Office action for Korean Application No. 10-2004-0104035, dated Aug. 31, 2006.
Japanese Office Action corresponding to Japanese Patent Application No. 2005-218939, issued on Jun. 26, 2007.

* cited by examiner

*Primary Examiner*—Michael Datskovskiy
(74) *Attorney, Agent, or Firm*—Robert E. Bushnell, Esq.

(57) ABSTRACT

A chassis structure for a plasma display module, and a plasma display module including the chassis structure effectively dissipate heat generated by a plasma display panel and improve assembly of the plasma display module. The chassis base includes: a front plate; a back plate separated from the front plate; and a heat dissipation member disposed between the front plate and the back plate, and having a bent cross-section arranged so that some surfaces of the heat dissipation member contact the front plate and some surfaces of the heat dissipation member contact the back plate to allow air flow between the front and back plate.

13 Claims, 8 Drawing Sheets

CHASSIS STRUCTURE FOR PLASMA DISPLAY MODULE AND PLASMA DISPLAY MODULE INCLUDING THE CHASSIS STRUCTURE

CLAIM OF PRIORITY

This application makes reference to, incorporates the same herein, and claims all benefits accruing under 35 U.S.C. § 119 from an application for CHASSIS STRUCTURE FOR PLASMA DISPLAY MODULE, AND PLASMA DISPLAY MODULE COMPRISING THE SAME, earlier filed in the Korean Intellectual Property Office on Dec. 10, 2004 and there duly assigned Ser. No. 10-2004-0104035.

BACKGROUND OF THE INVENTION

1. Field of the Invention

The present invention relates to a chassis structure for a plasma display module and a plasma display module including the plasma display module, and more particularly, to a chassis structure for a plasma display panel that effectively dissipates heat generated by a plasma display panel and improves assembly of the plasma display module, and a plasma display module including the chassis structure.

2. Description of the Related Art

In general, a plasma display panel is a flat panel display apparatus displaying images using a gas discharge phenomenon. Some of the advantages of the plasma display panel are a large screen with large viewing angle, small thickness, and high image quality. In the plasma display apparatus, a discharge occurs between electrodes due to a Direct Current (DC) or Alternating Current (AC) voltage supplied to the electrodes, and ultraviolet rays generated due to the gas discharge excite a phosphor material to emit visible light.

A plasma display module the plasma display module includes a plasma display panel, a plurality of circuit boards, on which circuits for driving the plasma display panel are mounted, and a chassis supporting the plasma display panel and the circuit boards.

The plasma display panel and the chassis are attached to each other via a dual-adhesive unit attached on a back surface of the plasma display panel, and the dual-adhesive unit is generally a dual-adhesive tape.

A heat dissipation sheet having excellent thermal conductivity is disposed between the plasma display panel and the chassis to dissipate the heat generated during driving the plasma display panel to the chassis.

The chassis is generally formed of metal such as aluminum, and is fabricated in a casting or a press process.

A circuit device is mounted on the circuit board, and the circuit board is mounted on the chassis using a boss and a screw bolt.

However, the chassis of such a plasma display module does not include a heat dissipation structure, and thus, it is difficult to effectively dissipate the heat transmitted to the chassis from the plasma display panel.

In addition, since the base portion of the chassis is formed as a single plate, processes for fabricating the boss having a female screw unit and pressing the boss 0 into the chassis to install the boss are required so as to fix the circuit boards onto the chassis. Therefore, the number of processes for assembling such a plasma display module is increased, and thus, fabrication of the plasma display module is expensive and time-consuming.

SUMMARY OF THE INVENTION

The present invention provides a chassis structure for plasma display module, which is capable of effectively dissipating heat generated by a plasma display panel and improving assembly of the plasma display module, and a plasma display module including the chassis structure.

According to one aspect of the present invention, a chassis structure for a plasma display module is provided, the chassis comprising: a front plate; a back plate separated from the front plate; and a heat dissipation member arranged between the front plate and the back plate, and having a bent cross-section arranged so that some surfaces of the heat dissipation member contact the front plate and some surfaces of the heat dissipation member contact the back plate to allow air flow between the front and back plates.

The heat dissipation member preferably comprises a serpentine cross-section. The heat dissipation member alternatively preferably comprises a convex-concave cross-section. The heat dissipation member preferably comprises a heat conductive material.

According to another aspect of the present invention, a plasma display module is provided comprising: a plasma display panel; at least one circuit board adapted to drive the plasma display panel; a front plate adapted to support the plasma display panel; a back plate adapted to support the at least one circuit board and separated from the front plate; and a heat dissipation member arranged between the front plate and the back plate, and having a bent cross-section arranged so that some surfaces of the heat dissipation member contact the front plate and some surfaces of the heat dissipation member contact the back plate to allow air flow between the front and back plate.

The plasma display module preferably further comprises a heat dissipation sheet arranged between the plasma display panel and the front plate.

The heat dissipation member preferably comprises a serpentine cross-section. The heat dissipation member alternatively preferably comprises a convex-concave cross-section. The heat dissipation member preferably comprises a heat conductive material.

The back plate preferably comprises an aperture adapted to fix the circuit board thereon.

The plasma display module preferably further comprise a connection unit adapted to fix the at least one circuit board on the back plate, wherein a first end of the connection unit is arranged on the at least one circuit board, and wherein a second end of the connection unit passes through the aperture to be arranged in a space between the front and back plates.

The second end of the connection unit preferably comprises a tapered wing. The connection unit preferably comprises a synthetic resin.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
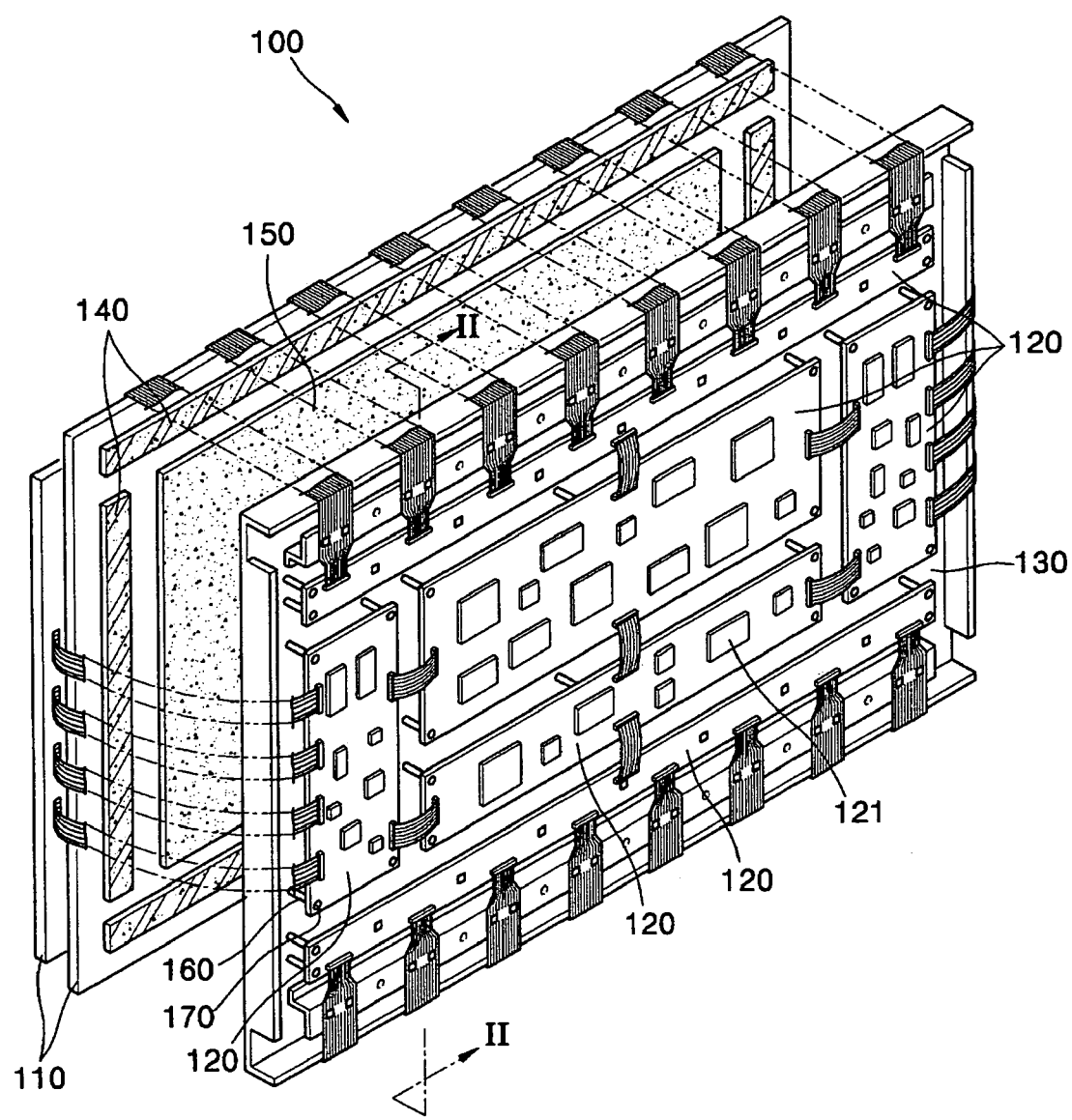
FIG. 1 is a perspective view of a plasma display module.
Figure 2:
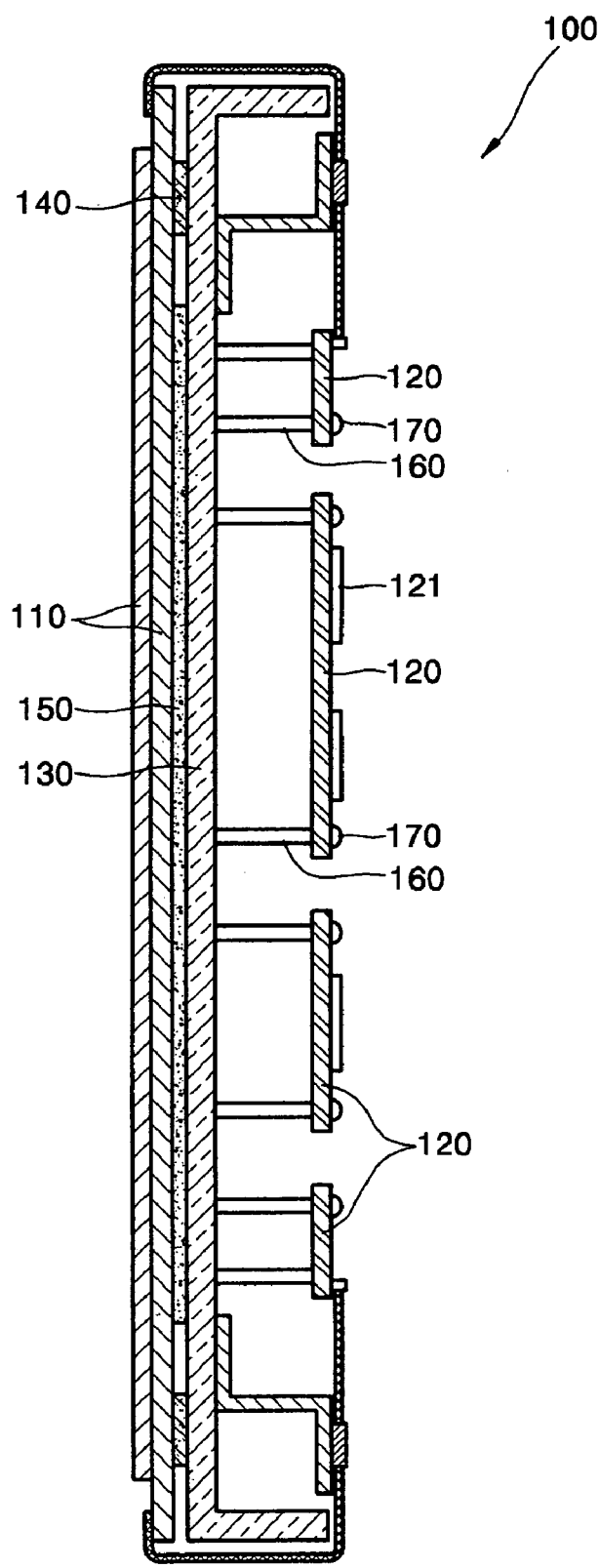
FIG. 2 is a cross-sectional view of the plasma display module taken along line II-II of FIG. 1.

FIG. 1 is a perspective view of a plasma display module in a plasma display apparatus, and FIG. 2 is a cross-sectional view of the plasma display module taken along line II-II of FIG. 1.

Referring to FIG. 1, the plasma display module 100 includes a plasma display panel 100, a plurality of circuit boards 120, on which circuits for driving the plasma display panel 110 are mounted, and a chassis 130 supporting the plasma display panel 110 and the circuit boards 120.

The plasma display panel 110 and the chassis 130 are attached to each other via a dual-adhesive unit 140 affixed to a back surface of the plasma display panel 110, and the dual-adhesive unit 140 is generally a dual-adhesive tape.

A heat dissipation sheet 150 having excellent thermal conductivity is disposed between the plasma display panel 110 and the chassis 130 to transmit the heat generated during the driving of the plasma display panel 110 to the chassis 130.

The chassis 130 is generally formed of metal such as aluminum, and is fabricated by casting or pressing.

A circuit device is mounted on the circuit board 120, and the circuit board 120 is mounted on the chassis 130 using a boss 160 and a screw bolt 170.

However, the chassis 130 of the plasma display module 100 does not include a heat dissipation structure, and thus, it is difficult to effectively dissipate the heat transmitted to the chassis 130 from the plasma display panel 110.

In addition, since the base portion of the chassis 130 is formed as a single plate, processes for fabricating the boss 160 having a female screw unit and pressing the boss 160 into the chassis 130 to install the boss 160 are required so as to fix the circuit boards 120 onto the chassis 130. Therefore, the number of processes for assembling the plasma display module is increased, and thus, fabrication of this plasma display module is expensive and time-consuming.

Figure 3:
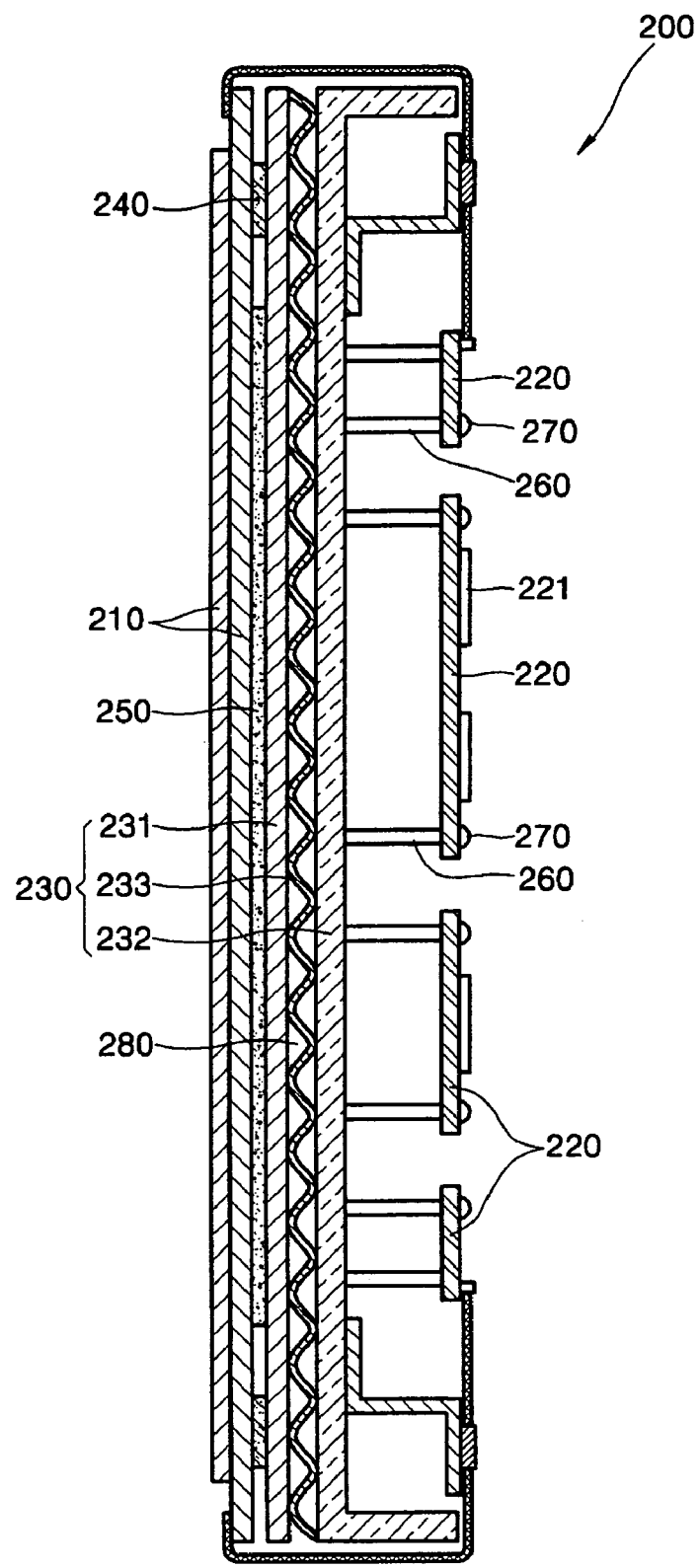
FIG. 3 is a cross-sectional view of a chassis structure of a plasma display module according to a first embodiment of the present invention.
Figure 4:
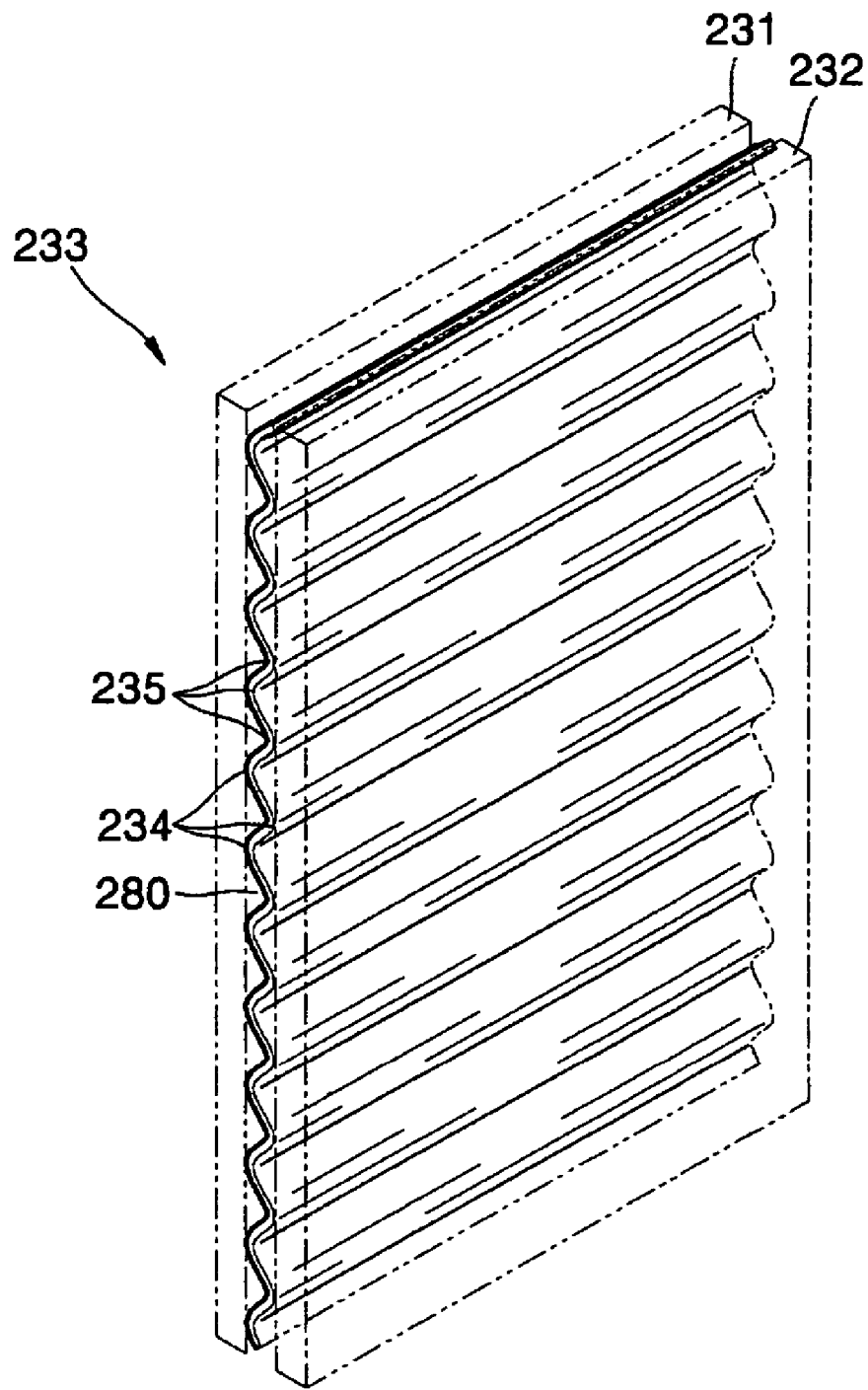
FIG. 4 is a perspective view of a heat dissipation member according to the first embodiment of the present invention.

Referring to FIGS. 3 and 4, a plasma display module 200 according to a first embodiment of the present invention includes a plasma display panel 210, a plurality of circuit boards 220, on which circuits for driving the plasma display panel 210 are mounted, and a chassis 230 supporting the plasma display panel 210 and the circuit boards 220.

The chassis 230 includes a front plate 231, a back plate 232, and a heat dissipation member 233.

The plasma display panel 210 and the front plate 231 are attached to each other by a dual-adhesive unit 240 affixed to a back surface of the plasma display panel 210, and a circuit device 221 is disposed on the circuit board 220.

A heat dissipation sheet 250 is disposed between the plasma display panel 210 and the front plate 231 to transmit heat generated by the plasma display panel 210 to the front plate 231.

The back plate 232 is separated a predetermined distance from the front plate 231, and the predetermined distance can be determined by a designer of the module in consideration of the heat dissipating performance and thickness of the plasma display module 200.

Figure 5:
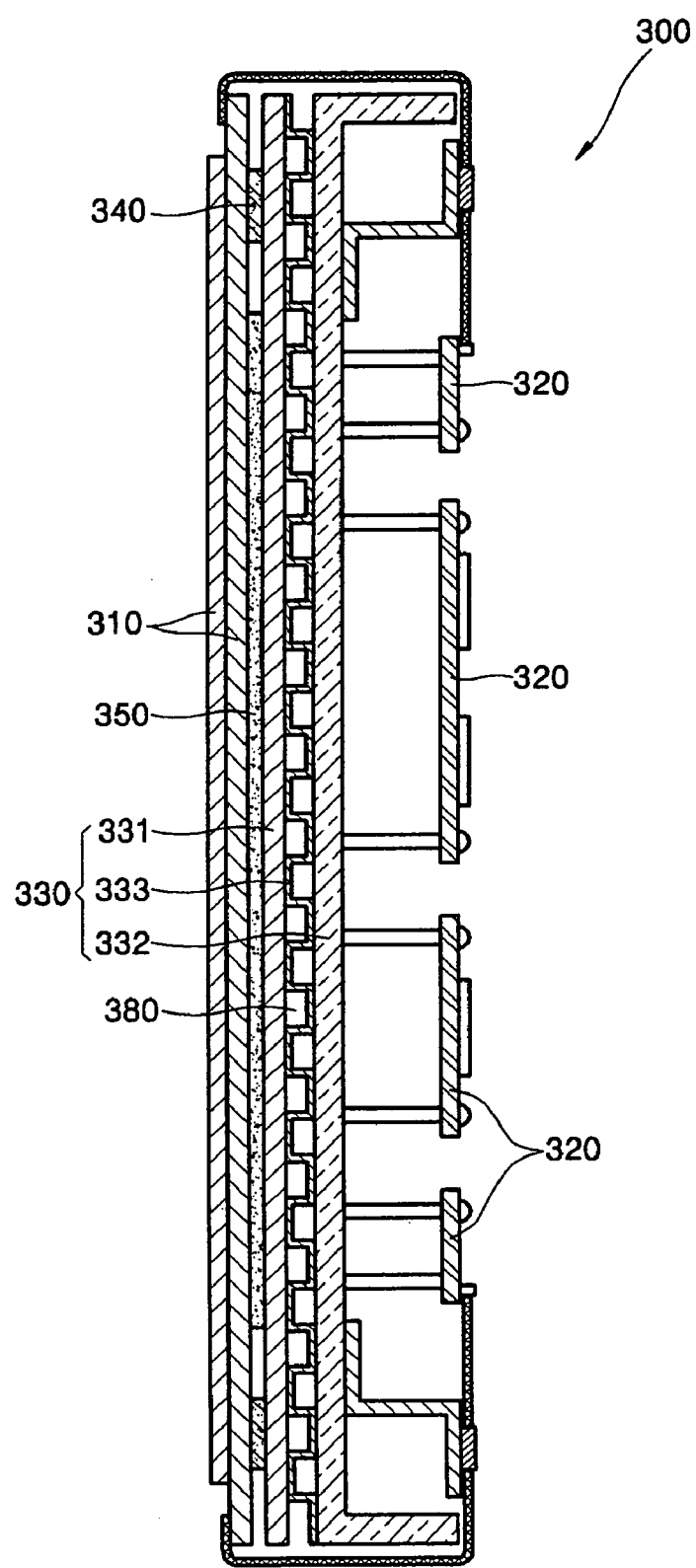
FIG. 5 is a cross-sectional view of a modified example of chassis structure of the plasma display module according to the first embodiment of the present invention.

In FIGS. 4 and 5, the heat dissipation member 233 is located between the front plate 231 and the back plate 232, and has a serpentine cross-section. In addition, the heat dissipation member 233 is formed of a thermally conductive material, that is, generally metal.

Ridge portions 234 of the heat dissipation member 233 contact the front plate 231 and the back plate 232. In addition, valley portions 235 at the opposing side of the ridge portions 234, the front plate 231, and the back plate 232 form air flow paths 280. Therefore, some of the heat transmitted to the heat dissipation member 233 is transmitted to the air flowing in the air flow paths 280 to be dissipated, and the residual heat transmitted to the heat dissipation member 233 is transmitted to the back plate 232 and dissipated.

It is desirable that the heat dissipation member 233 bent with a constant curvature is disposed between the front plate 231 and the back plate 232, and then, these elements are brazed together.

The circuit board 220 is mounted on the back plate 232 using a boss 260 and a screw bolt 270.

The operation of the chassis structure according to the first embodiment of the present invention is as follows.

When the plasma display module 200 is driven, a lot of heat is generated by the plasma display panel 210. The generated heat is transmitted to the front plate 231 after passing through the heat dissipation sheet 250.

The heat transmitted to the front plate 231 is transmitted to the heat dissipation member 233. Since the heat dissipation member 233 has a serpentine cross-section, a surface area of the heat dissipation member 233 is large, and a plurality of air flow paths 280 are formed, and thus, a large amount of the heat transmitted to the heat dissipation sheet 233 is dissipated out of the chassis 230.

That is, since the edges of the chassis 230 are open, external air can be induced and discharged into/out of the chassis 230. The air induced in the chassis 230 absorbs the heat while contacting the heat dissipation member 233, and then, is exhausted out of the chassis 230. Thus, a large amount of the heat transmitted to the heat dissipation member 233 can be exhausted effectively out of the chassis 230 by the air induced in the chassis 230.

In addition, the residual heat transmitted to the heat dissipation member 233 is transmitted to the back plate 232 and dissipated.

That is, according to the first embodiment of the present invention, the chassis 230 includes the front plate 231, the back plate 232, and the heat dissipation member 233, and the heat generated by the plasma display panel 210 is effectively dissipated by the heat dissipation member 233.

Hereinafter, a modified example of the above chassis structure according to the first embodiment of the present invention is described with reference to FIGS. 5-7, and different elements from those of the above example are described.

Figure 6:
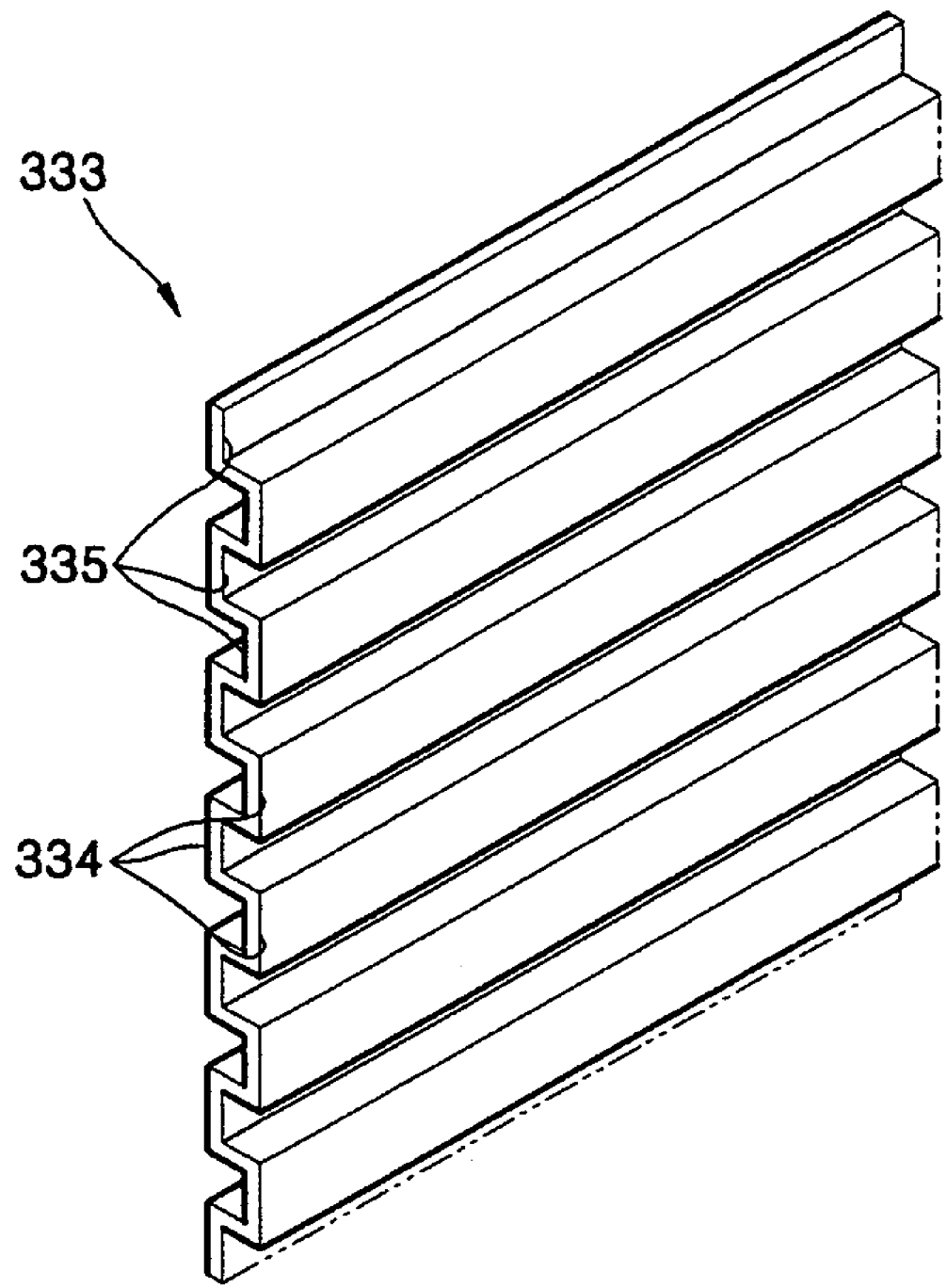
FIG. 6 is a perspective view of a modified example of the heat dissipation member according to the first embodiment of the present invention.

FIG. 5 is a cross-sectional view of a modified example of chassis structure of the plasma display module according to the first embodiment of the present invention, and FIG. 6 is a perspective view of a modified example of the heat dissipation member according to the first embodiment of the present invention.

The plasma display module 300 includes a plasma display panel 310, circuit boards 320, and a chassis 330.

The chassis 330 includes a front plate 331, a back plate 332, and a heat dissipation member 333, and the plasma display panel 310 is supported at the front plate 331 using a dual-adhesive unit 340.

Compared to the above first embodiment, the modified example of the first embodiment has a heat dissipation member 333 of a different shape than that of the heat dissipation member 233 of FIGS. 3-4.

That is, unlike the heat dissipation member 233 having the serpentine cross-section, the modified heat dissipation member 333 has a convex-concave cross-section.

The heat dissipation member 333 is formed of a thermally conductive material. Ridge portions 334 of the heat dissipation member 333 contact the front plate 331 and the back plate 332. Valley portions 335 at the opposing side of the ridge portions 334, the front plate 331, and the back plate 332 form air flow paths 380.

Therefore, the heat generated by the plasma display panel 310 is transmitted to the front plate 331 through the heat dissipation sheet 350. A large amount of the heat transmitted to the front plate 331 is transmitted to the heat dissipation member 333, and some of the heat transmitted to the heat dissipation member 333 is absorbed by the air flowing in the air flow paths 380 to be dissipated, and the residual heat transmitted to the heat dissipation member 333 is transmitted to the back plate 332 and dissipated.

Figure 7:
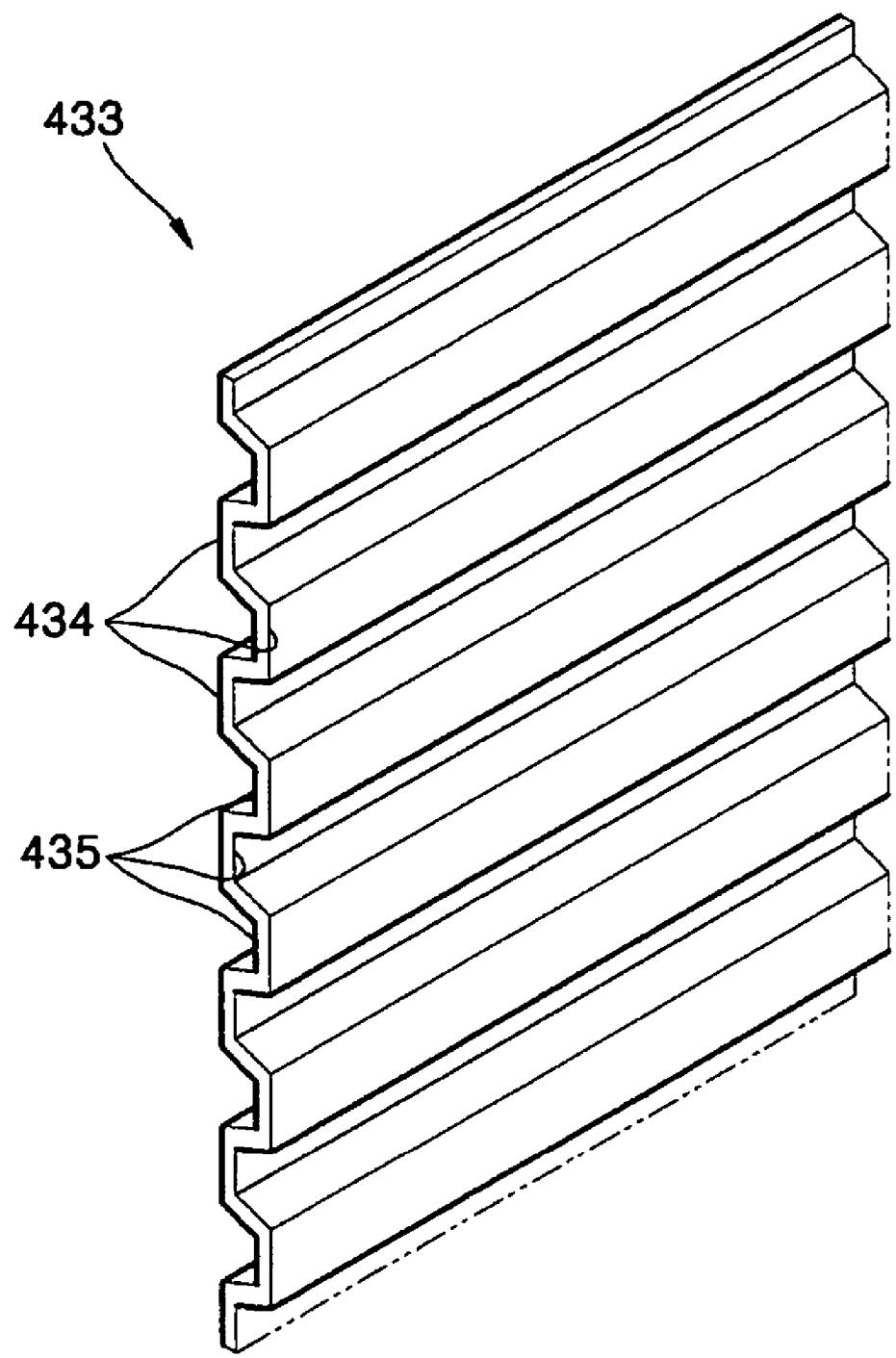
FIG. 7 is a perspective view of another modified example of the heat dissipation member according to the first embodiment of the present invention.

FIG. 7 is a perspective view of another modified example of the heat dissipation member according to the first embodiment of the present invention. The heat dissipation member 433 is formed by slightly changing the shape of the heat dissipation member 333 of FIG. 6. That is, connections between ridge portions 434 and valley portions 435 are slanted.

The elements of the modified examples of the heat dissipation member perform the same functions as those of the elements in the dissipation member of the first embodiment. However, the heat dissipation members 333 and 433 of FIGS. 5-7 have larger ridge portions 334 and 434 contacting the front and back plates 231 and 232 than those of the heat dissipation member 233 of the first embodiment. Therefore, the heat dissipation members 333 and 433 have some different characteristics from those of the heat dissipation member 233 in that the heat from the plasma display panel can be easily transmitted to the heat dissipation members 333 and 433 and that the heat dissipation members 333 and 433 have relatively smaller heat dissipation surface area.

Hereinafter, a plasma display module according to a second embodiment of the present invention is described with reference to FIG. 8.

The plasma display module 500 according to the second embodiment of the present invention includes a plasma display panel 510, a plurality of circuit boards 520, on which circuits driving the plasma display panel 510 are mounted, and a chassis 530 supporting the plasma display panel 510 and the circuit boards 520.

The chassis 530 includes a front plate 531, a back plate 532, and a heat dissipation member 533.

The plasma display panel 510 and the front plate 531 of the chassis 530 are attached to each other by a dual-adhesive unit 540 affixed to a back surface of the plasma display panel 510.

A heat dissipation sheet 550 is disposed between the front plate 531 and the plasma display panel 510 to transmit the heat generated by the plasma display panel 510 to the front plate 531.

The back plate 532 is separated a predetermined distance from the front plate 531, and a heat dissipation member 533 is located between the front plate 531 and the back plate 532. In addition, air flow paths 580 are formed by the front plate 531, the back plate 532, and the heat dissipation member 533.

The heat dissipation member 533 has the same structure and function as those of the heat dissipation member 433 of the previous embodiment.

That is, the heat generated when the plasma display panel 510 is driven is transmitted to the heat dissipation member 533 after passing through the heat dissipation sheet 550, and some of the heat transmitted to the heat dissipation member 533 is absorbed by the air flowing in the air flow paths 580 and dissipated, and the residual heat is transmitted to the back plate 532 and dissipated.

In addition, the back plate 532 includes holes 590 for fixing the circuit boards 520, and the circuit boards 520 are fixed on the back plate 532 by connection units 570.

The connection unit 570 is formed of synthetic resin. In addition, a first end 571 of the connection unit 570 is mounted on the circuit board 520, and a second end 572 of the connection unit 570 passes through the hole 590 formed on the back plate 532 and is located in the space between the front plate 531 and the back plate 532.

The second end 572 of the connection unit 570 includes a wing part 573 having tapered shape, and thus, it can be only inserted into the hole 590 formed on the back plate 532 in one direction, and when the second end 572 of the connection unit 570 is inserted into the hole 590, the wing part 573 is bent inward.

After the wing part 573 of the connection unit 570 passes through the hole 590, the wing part 573 is recovered to the original status by an elastic force, and thus, the second end 572 of the connection unit 570 is located between the front plate 531 and the back plate 532. Therefore, the second end 572 of the connection unit 570 and a suspending step 574 can fix the circuit board 520 onto the back plate 532.

Figure 8:
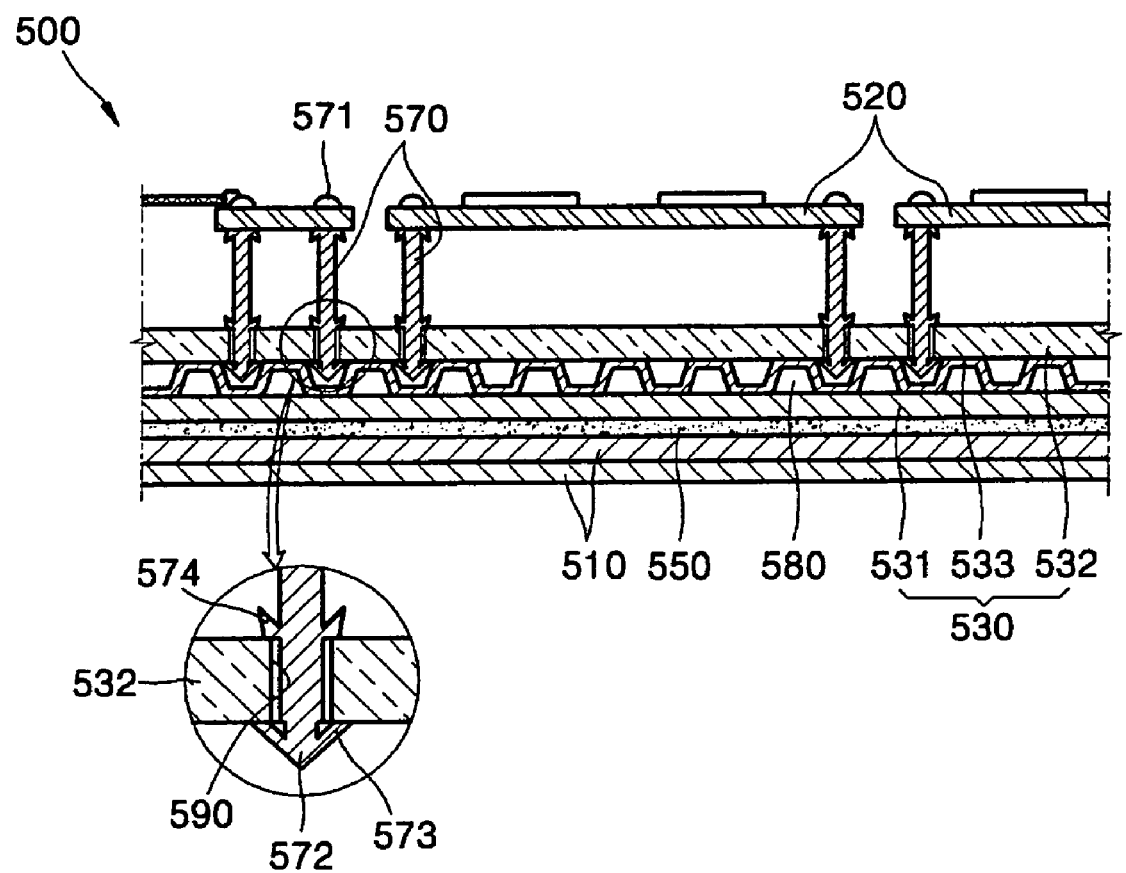
FIG. 8 is a partial cross-sectional view of a chassis structure of a plasma display module according to a second embodiment of the present invention.

In addition, referring to FIG. 8, it is desirable that the end 572 of the connection unit 570 is located toward the valley portion of the heat dissipation member 533 avoiding from the ridge portion of the heat dissipation member 533.

Therefore, in order to assemble the plasma display module 500 according to the second embodiment of the present invention, the circuit board 520 can be firmly fixed on the back plate 532 simply by mounting the first end 571 of the connection unit 570 on the circuit board 520 and pushing the second end 572 of the connection unit 570 into the hole 590 of the back plate 532. Therefore, a process of forming the boss on the chassis for fixing the circuit board on the chassis is not necessary.

The assembling way of the plasma display module 500 according to the second embodiment of the present invention cannot be applied to a conventional plasma display module, in which the chassis is formed as a single plate, since the second end 572 of the connection unit 570 collides with the plasma display panel in the conventional plasma display module even if the connection unit 570 is inserted after forming the hole on the chassis. Therefore, the connection unit 570 cannot be fixed on the chassis of the conventional plasma display module. That is, since the chassis of the conventional plasma display module is formed as a single plate, there is no space to receive the second end 572 of the connection unit 570, and thus, the connection unit 570 cannot be fixed on the chassis in the conventional plasma display module.

According to the plasma display module of the second embodiment of the present invention, since the chassis 530 includes the front plate 531, the back plate 532, and the heat dissipation member 533, the heat dissipation member 533 can effectively dissipate the heat transmitted to the front plate 531. In addition, the circuit boards 520 can be mounted on the back plate 532 in easy and effective way by using the space between the front plate 531 and the back plate 532 and the connection unit 570.

As described above, according to the present invention, the chassis includes the front plate, the back plate, and the heat dissipation member, and thus, the heat generated by the plasma display panel can be dissipated using the heat dissipation member.

In addition, since the front plate and the back plate are separated a predetermined distance from each other, the circuit board can be mounted on the back plate in easy and effective way using the connection unit, and the assembling convenience of the plasma display module can be improved. Therefore, the production time and manufacturing costs can be reduced.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed:

1. A chassis structure for a plasma display module, the chassis comprising:
   a front plate;
   a back plate separated from the front plate, the back plate including an aperture adapted to fix a circuit board thereon;
   a heat dissipation member arranged between the front plate and the back plate, and having a bent cross-section arranged so that some surfaces of the heat dissipation member contact the front plate and some surfaces of the heat dissipation member contact the back plate to allow air flow between the front and back plates; and
   a connection unit adapted to fix the at least one circuit board on the back plate, wherein a first end of the connection unit is arranged on the at least one circuit board, and wherein a second end of the connection unit passes through the aperture to be arranged in a space between the front and back plates.

2. The chassis structure of claim 1, wherein the heat dissipation member comprises a serpentine cross-section.

3. The chassis structure of claim 1, wherein the heat dissipation member comprises a convex-concave cross-section.

4. The chassis base of claim 1, wherein the heat dissipation member comprises a heat conductive material.

5. A plasma display module, comprising:
   a plasma display panel;
   at least one circuit board adapted to drive the plasma display panel;
   a front plate adapted to support the plasma display panel;
   a back plate adapted to support the at least one circuit board and separated from the front plate, the back plate including an aperture adapted to fix the circuit board thereon;
   a heat dissipation member arranged between the front plate and the back plate, and having a bent cross-section arranged so that some surfaces of the heat dissipation member contact the front plate and some surfaces of the heat dissipation member contact the back plate to allow air flow between the front and back plate; and
   a connection unit adapted to fix the at least one circuit board on the back plate, wherein a first end of the connection unit is arranged on the at least one circuit board, and wherein a second end of the connection unit passes through the aperture to be arranged in a space between the front and back plates.

6. The plasma display module of claim 5, further comprising a heat dissipation sheet arranged between the plasma display panel and the front plate.

7. The plasma display module of claim 5, wherein the heat dissipation member comprises a serpentine cross-section.

8. The plasma display module of claim 5, wherein the heat dissipation member comprises a convex-concave cross-section.

9. The plasma display module of claim 5, wherein the heat dissipation member comprises a heat conductive material.

10. The plasma display module of claim 5, wherein the second end of the connection unit comprises a tapered wing.

11. The plasma display module of claim 5, wherein the connection unit comprises a synthetic resin.

12. The chassis structure of claim 1, wherein the second end of the connection unit comprises a tapered wing.

13. The chassis structure of claim 1, wherein the connection unit comprises a synthetic resin.

* * * * *